(12) United States Patent
Parvizi et al.

(10) Patent No.: US 11,245,401 B2
(45) Date of Patent: Feb. 8, 2022

(54) APPARATUS AND METHODS FOR HIGH FREQUENCY CLOCK GENERATION

(71) Applicant: Ciena Corporation, Hanover, MD (US)

(72) Inventors: Mahdi Parvizi, Kanata (CA); Sadok Aouini, Gatineau (CA); Naim Ben-Hamida, Nepean (CA); Yuriy Greshishchev, Ottawa (CA); Douglas Stuart McPherson, Ottawa (CA); Robert Gibbins, Stittsville (CA); Anna Sakharova, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/123,964

(22) Filed: Dec. 16, 2020

(65) Prior Publication Data
US 2021/0313992 A1    Oct. 7, 2021

Related U.S. Application Data

(63) Continuation of application No. 16/839,511, filed on Apr. 3, 2020, now Pat. No. 10,903,841.

(51) Int. Cl.
*H03M 1/12* (2006.01)
*H03L 7/08* (2006.01)

(52) U.S. Cl.
CPC .................................... *H03L 7/08* (2013.01)

(58) Field of Classification Search
CPC .......................................................... H03L 7/08
USPC ......................................................... 341/155
See application file for complete search history.

(56) References Cited

U.S. PATENT DOCUMENTS

| | | | |
|---|---|---|---|
| 5,180,994 A | 1/1993 | Martin et al. | |
| 6,480,046 B1 | 11/2002 | Camp, Jr. | |
| 8,797,069 B2 * | 8/2014 | Hesen | H03K 21/026 327/115 |

(Continued)

OTHER PUBLICATIONS

E. Monaco, M. Pozzoni, F. Svelto and A. Mazzanti, "Injection-Locked CMOS Frequency Doublers for μ-Wave and mm-Wave Applications," in IEEE Journal of Solid-State Circuits, vol. 45, No. 8, pp. 1565-1574, Aug. 2010.

(Continued)

*Primary Examiner* — Peguy Jean Pierre
(74) *Attorney, Agent, or Firm* — Young Basile Hanlon & MacFarlane, P.C.

(57) ABSTRACT

Described are apparatus and methods for high frequency clock generation. A circuit includes a phase frequency detector (PFD) which outputs differential error clocks based on comparison of differential reference clocks and differential feedback clocks, which are at a first frequency. A controlled oscillator (CO) connected to the PFD, which adjusts a frequency of the CO based on the differential error clocks to generate differential clocks at a second frequency, which is a multiple of the first frequency. A quadrature clock generator connected to the CO, which generates differential quadrature clocks at the second frequency from the differential clocks, where the differential feedback clocks are generated from the differential clocks and one pair of the differential quadrature clocks. A frequency doubler which doubles each pair of the differential quadrature clocks and outputs fully differential and balanced clocks at a third frequency for distribution, which is a multiple of the second frequency.

20 Claims, 8 Drawing Sheets

(56) References Cited

U.S. PATENT DOCUMENTS

2016/0013816 A1    1/2016   Xia et al.
2017/0040941 A1    2/2017   Chatwin

OTHER PUBLICATIONS

M. Parvizi, K. Allidina and M. N. El-Gamal, "An ultra-low power, low voltage CMOS squarer circuit for non-coherent IR-UWB receivers," in IEEE International Symposium on Circuits and Systems (ISCAS), Seoul, 2012, pp. 2533-2536.

\* cited by examiner

APPARATUS AND METHODS FOR HIGH FREQUENCY CLOCK GENERATION

CROSS REFERENCE TO RELATED APPLICATIONS

This application is a continuation of U.S. patent application Ser. No. 16/839,511, filed on Apr. 3, 2020, the entire content of which is incorporated by reference.

TECHNICAL FIELD

This disclosure relates to clock generation circuits. More specifically, this disclosure relates to high frequency clock multiplication.

BACKGROUND

The need for higher frequency clocks in optical transceivers grows as the data rate in optical coherent modems increases. However, the capacity of semiconductor technologies optimized for high-speed digital signal processing and data processing is lacking for generating spectrally pure high frequency clocks using direct generation techniques. Moreover, even if the technology is capable, the clock generation circuitry can be complex, the performance poor, and the power consumption high.

SUMMARY

Described herein are apparatus and methods for high frequency clock generation.

In implementations, a high frequency clock generation circuit includes a phase frequency detector (PFD) configured to output differential error clocks based on comparison of differential reference clocks and differential feedback clocks, where the differential reference clocks and differential feedback clocks are at a first frequency, a controlled oscillator (CO) connected to the PFD, the CO configured to adjust a frequency of the CO based on the differential error clocks to generate differential clocks at a second frequency, wherein the second frequency is a multiple of the first frequency, a quadrature clock generation circuit connected to the CO, the quadrature clock generation circuit configured to generate differential quadrature clocks at the second frequency from the differential clocks, wherein the differential feedback clocks are generated from the differential clocks and one pair of the differential quadrature clocks, and a frequency doubler circuit configured to frequency double each pair of the differential quadrature clocks and output fully differential and balanced clocks at a third frequency for circuit distribution, wherein the third frequency is a multiple of the second frequency.

In implementations, a device including a phase locked loop, and a frequency multiplier circuit coupled to an output of the phase locked loop. The phase locked loop includes a detector configured to compare differential reference clocks and differential feedback clocks, where the differential reference clocks and differential feedback clocks are at a first clock rate, wherein the first clock rate is a multiple of a sampling rate, a voltage-controlled oscillator (VCO) connected to the detector, the VCO configured to generate differential clocks at a second clock rate by adjusting a frequency of the VCO based on a detector output, wherein the second clock rate is a multiple of the first clock rate, and a quadrature clock generator connected to the VCO, the quadrature clock generator configured to generate differential quadrature phase clocks and differential in-phase clocks from at the second clock rate from the differential clocks, the differential quadrature phase clocks and the differential in-phase clocks being an output of the phase locked loop, wherein the differential feedback clocks are generated from the differential clocks and one of the differential quadrature phase clocks and the differential in-phase clocks; and the frequency multiplier circuit configured to separately frequency multiply the differential quadrature phase clocks and the differential in-phase clocks and output, for device distribution, fully differential and balanced clocks at a third clock rate, wherein the third clock rate is a Nyquist rate.

In implementations, a method for high frequency clock generation, the method including generating differential clocks from a comparison of differential reference clocks at a first frequency and differential feedback clocks at the first frequency, wherein the differential clocks are at a second frequency and the second frequency is a multiple of the first frequency, generating differential quadrature clocks at the second frequency from the differential clocks, generating the differential feedback clocks from the differential clocks and one pair of the differential quadrature clocks, frequency doubling each pair of the differential quadrature clocks to a third frequency, wherein the third frequency is a multiple of the second frequency, and outputting fully differential and balanced clocks by coupling each of the frequency doubled differential clocks. In implementations, the method further includes actively controlling a quadrature phase deviation of the differential quadrature clocks by adjusting a regulator voltage supply when generating the differential quadrature clocks. In implementations, the generating differential clocks, the generating differential quadrature clocks, and the generating the differential feedback clocks are performed in a feedback loop.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
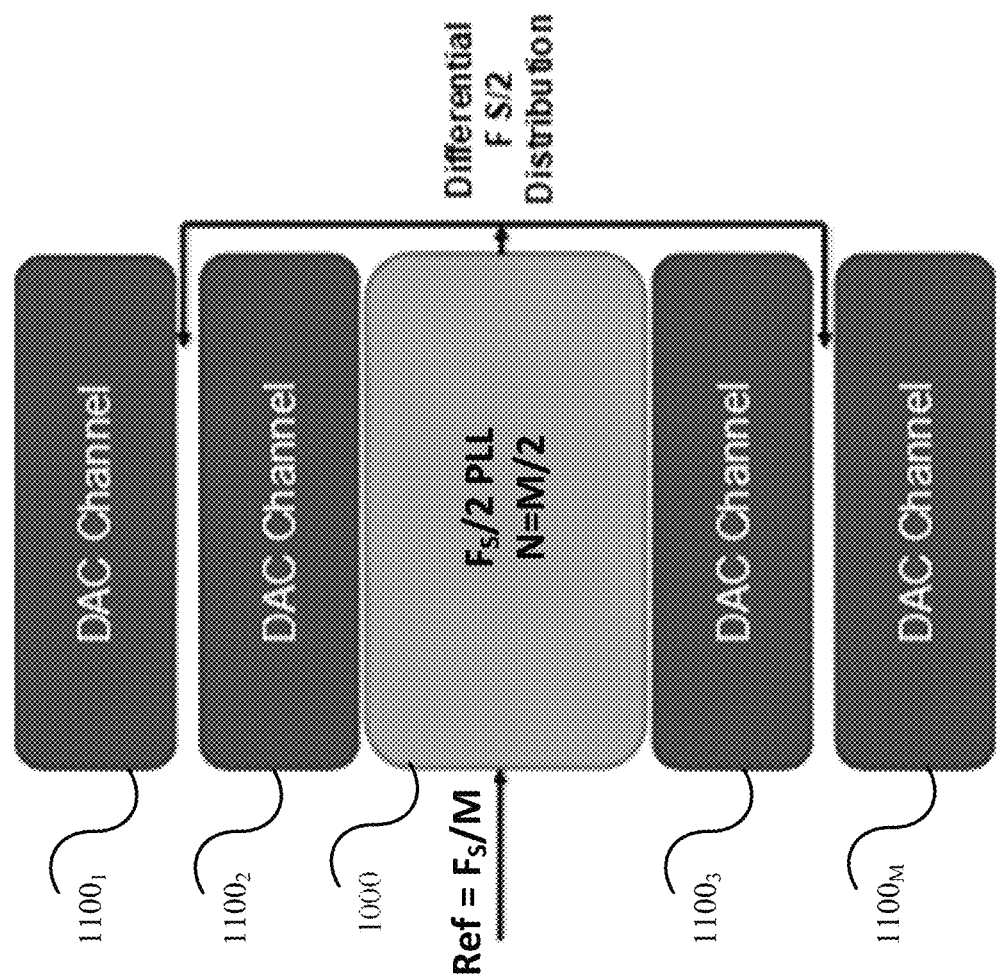
FIG. 1 is a block diagram of an example of a phase locked loop having a high divide ratio.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

A challenge in high-speed digital to analog converter (DAC) design is the need for $F_S/2$ clocks for the final data interleaving or multiplexing stages. For example, an 800 GHz coherent optical communications link may have a sampling rate ($F_S$) of the order of 120 Gs/s, with the final multiplexer stage selecting alternate data streams on the rising and falling edge of a clock that is half the output sampling rate ($F_S/2$), or 60 GHz. A conventional technique is to use a voltage-controlled oscillator (VCO) with a center frequency of $F_S/2$ and build a phase-locked loop (PLL) around it. This PLL is locked to a clock reference such as a clock multiplied quartz crystal. The highest frequency that conventional low jitter reference clocks can reach is approximately 2 GHz. To clock multiply this reference to the $F_S/2$ center frequency requires a large divide ratio in the PLL feedback path. FIG. 1 is a block diagram of an example of a phase locked loop 1000 having a high divide ratio. As shown, a reference $F_S/M$ clock is input into the PLL 1000 which has a large divide ration of N=M/2. For example, M can be 64. Accordingly, the output of the PLL 1000 is a $F_S/2$ clock which is distributed to the DACs 1100$_{1-m}$. The use of a large divide ratio results in a decrease in PLL bandwidth which leads to a reduction in the suppression of the VCO noise and an increase in the jitter contribution of the charge pump (CP), frequency divider (FD), and phase frequency detector (PFD). That is, for example, the larger the divide ratio the higher the jitter performance of the PLL In addition, the VCO design at $F_S/2$ frequencies using semiconductor technology developed for low-power digital applications (~60 GHz) is very difficult due to the low-quality factor (Q factor) of the inductors, capacitors, and varactors that form the resonator of the oscillator. In combination with the inherent noise generated by the switching transistors in the VCO, the Q factor of the resonator define the VCOs phase noise. The Q factor and the transistor noise increase at an ever-increasing rate as the center frequency increases. If this degradation did not occur, two VCOs at different center frequencies would have the same normalized phase noise. Since this is not the case and the normalized performance of the lower frequency VCO is superior to that of the higher frequency VCO, clock multiplication is an attractive technique to circumvent the semiconductor technologies limitations.

A frequency doubler at the output of the PLL can be used to reduce the divide ratio in a PLL and permit the use of an $F_S/4$ VCO. The $F_S/4$ VCO has a lower normalized jitter than an $F_S/2$ equivalent and reduces the PLL feedback divide ratio by a factor of 2. Conventional frequency doubling techniques use frequency doublers that produce a single phase of the doubled clock from two phases of the half frequency clock (clock & clockb at $F_S/4$).

Alternatively, the frequency doubling techniques use a combination of p-type metal-oxide-semiconductor (PMOS) and n-type metal-oxide-semiconductor (NMOS) transistors to generate the complementary outputs. A disadvantage of creating complementary doubled clocks (a clock pair) using this technique is that the resulting clock pair have large phase and amplitude mismatch. In addition, the NMOS and PMOS devices generate differential signals that have significant asymmetry between the differential outputs over process corners. When the PMOS and NMOS devices differ in speed and/or transducer gain, the differential outputs are skewed in time with respect to each other, the amplitudes are mismatched, and the duty cycle distortion (DCD) of the outputs degrade switching performance of the final interleaving or multiplexer stage in the DAC. Since differential clocks and their character directly affect the DAC performance, circuits that only create single-ended $F_S/4$ outputs are of little practical use.

Described herein are apparatus, devices, circuits, systems, and methods for high frequency clock generation or high-speed clock multiplication. The frequency multiplying circuit simplifies the phase-locked loop (PLL) of which the clock generator is a part, reduces the clock jitter, and outputs a fully differential and balanced $F_S/2$ clock. In implementations, the fully differential and balanced $F_S/2$ clock is generated from differential in-phase and quadrature $F_S/4$ clocks. In implementations, the differential in-phase and quadrature $F_S/4$ clocks are generated using an injection locked $F_S/4$ quadrature ring oscillator in the PLL loop. In implementations, the phase alignments of the differential in-phase and quadrature $F_S/4$ clocks are actively controlled over supply, temperature, and process (STP) variations using an active feedback loop.

In implementations, the high frequency clock generation circuit generates an accurate differential $F_S/2$ clock from $F_S/4$ quadrature clocks over a wide frequency range, which in turn supports multiple baud-rates. The circuit uses an injection locked quadrature ring oscillator and signal squaring circuits to create accurate differential $F_S/4$ inputs for each of the $F_S/2$ doubler circuits. The injection locked quadrature ring oscillator is provided in the PLL feedback loop to reduce supply induced jitter as well as any noise created by the injection locked quadrature ring oscillator. A digital loop is provided to adjust in-phase and quadrature phase alignment to compensate for imbalances, centering, and STP variations.

In implementations, a quadrature injection-locked ring oscillator covering a wide frequency range around $F_S/4$ provides four $F_S/4$ clock phases spaced apart from each other by one quarter cycle at $F_S/4$. A VCO with an inductor-capacitor tank and a cross-coupled CMOS pair locked by the PLL provides the injected signal for the ring oscillator. Injection of the differential $F_S/4$ clock into the ring oscillator allows for high injection bandwidth on the ring oscillator and consequently reduces jitter up to the injection locking bandwidth. The four phases of the quadrature ring oscillator are fed into two signal squaring circuits and by doubling of $F_S/4$ clocks generates differential $F_S/2$ output clocks.

Figure 2:
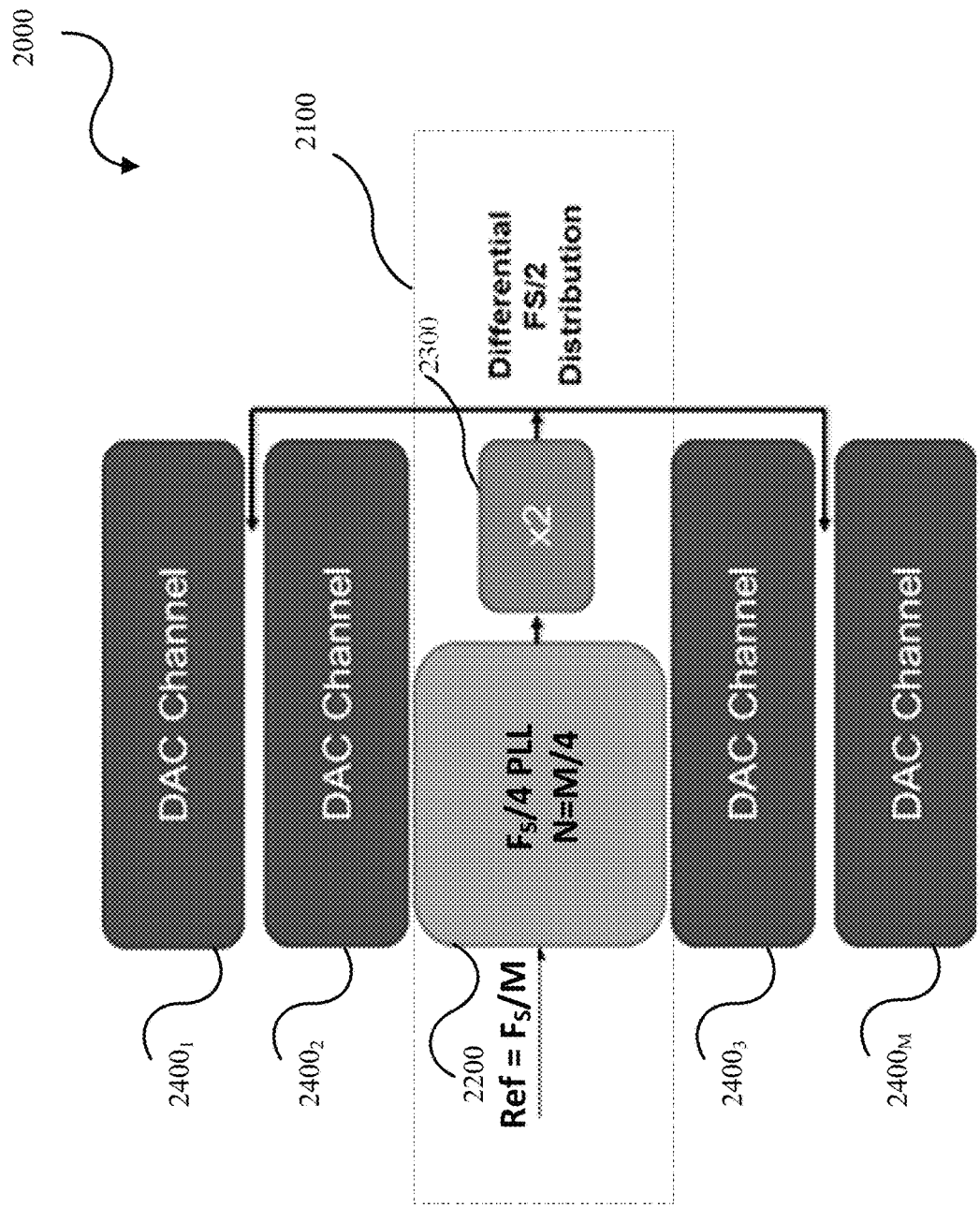
FIG. 2 is a block diagram of an example of phase locked loop and clock multiplication in accordance with embodiments of this disclosure.

FIG. 2 is a block diagram of an example of a device 2000 which includes a high frequency clock generation 2100 in accordance with embodiments of this disclosure. The high frequency clock generation circuit 2100 includes a PLL 2200 connected to, coupled with, or in communication with (collectively "connected to") a frequency doubler circuit 2300, which in turn in connected to a plurality of DACs 2400$_{1-M}$. Differential reference $F_S/M$ clocks are input into the PLL 2200, which has a divide ratio of N=M/4. For example, M can be 64. The output of the PLL 2200 are differential in-phase and quadrature phase $F_S/4$ clock pairs which are each multiplied using associated frequency doublers in the frequency doubler circuit 2300. The output of the frequency doubler circuit 2300 is a fully differential and balanced $F_S/2$ clock which is distributed to the DACs 2400$_{1-M}$.

Figure 3:
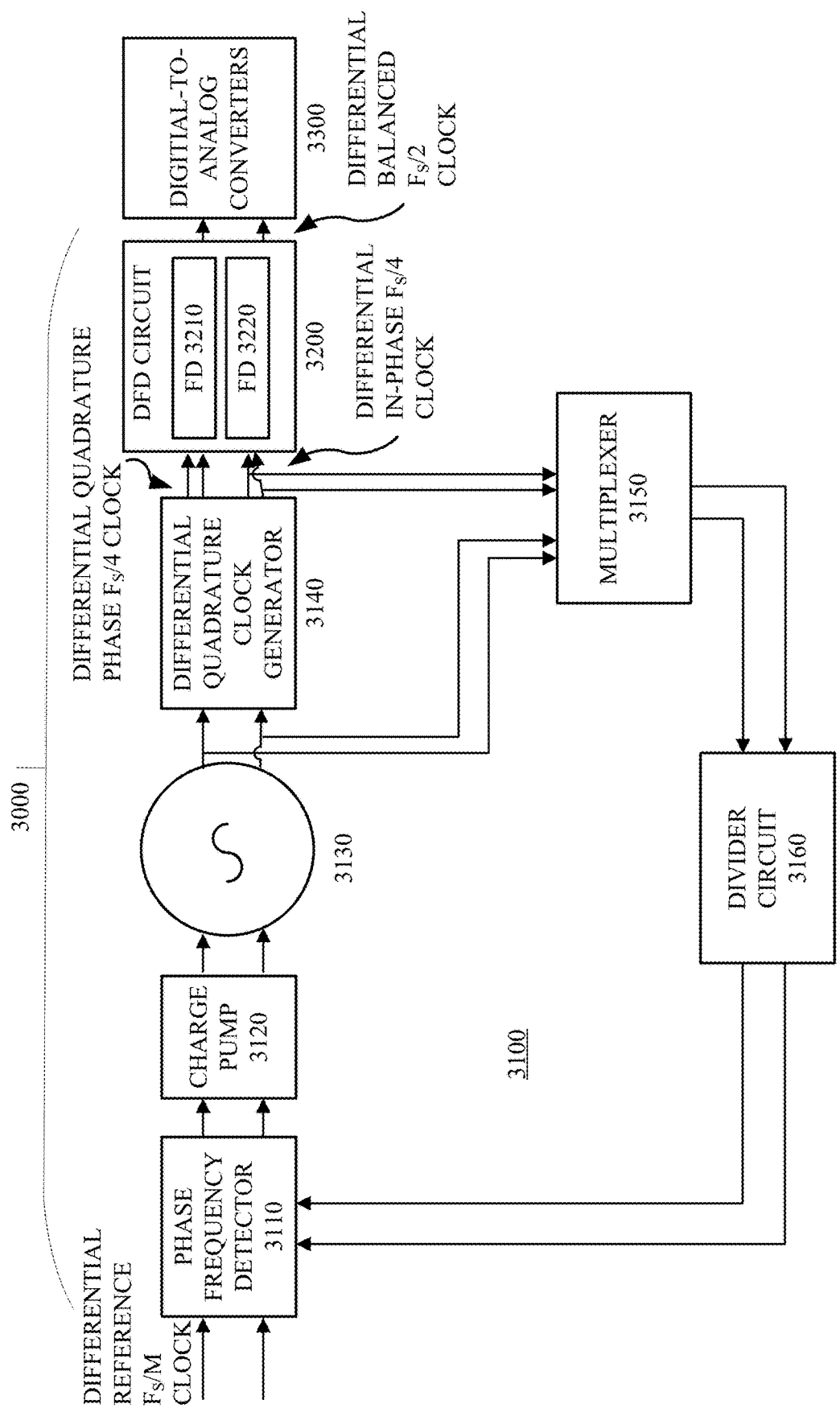
FIG. 3 is a block diagram of an example of a high frequency clock generation circuit in accordance with embodiments of this disclosure.

FIG. 3 is a block diagram of an example of a high frequency clock generation circuit 3000 in accordance with embodiments of this disclosure. The high frequency clock generation circuit 3000 includes a PLL 3100 which has inputs connected to a differential reference clock having a first frequency or clock rate (collectively "frequency") and differential quadrature clock outputs having a second frequency connected to a differential frequency doubler circuit 3200, which in turn has fully differential and balanced outputs having a third frequency distributed to one or more DACs 3300. In implementations, the first frequency is a multiple of a sampling frequency ($F_S$). In implementations, the first frequency is $F_S/M$. For example, M can be 64. In implementations, the second frequency is a multiple of the first frequency. In implementations, the second frequency is $F_S/4$. In implementations, the third frequency is a multiple of the first frequency and/or the second frequency. In implementations, the third frequency is $F_S/2$.

The PLL 3100 includes a phase frequency detector 3110 which has inputs connected to the differential reference clock and differential outputs connected to a charge pump 3120. The differential outputs of the charge pump 3120 are connected to inputs of a differential voltage-controlled oscillator (VCO) 3130 operating at the second frequency. The differential outputs of the VCO 3130, which are at the second frequency, are connected to inputs of a differential quadrature clock generator 3140. The differential quadrature clock outputs are the output of the PLL 3100. One pair of the differential quadrature clock outputs and the differential outputs of the VCO 3130 are coupled to the phase frequency detector 3110 as a differential feedback clock via a multiplexer 3150 and a divider circuit 3160, where the differential feedback clock is at the first frequency. In implementations, the divider circuit 3160 is a divide by M/4 circuit. Each pair of the differential quadrature clock outputs, the differential quadrature phase clock output and the differential in-phase clock output, are each connected to a frequency doubler 3210 and 3220, respectively, of the differential frequency doubler circuit 3200. The fully differential and balanced outputs of the differential frequency doubler circuit 3200 are connected to the one or more DACs 3300.

Operationally, the phase frequency detector 3110 outputs a differential difference or error signal that is proportional to a phase difference between the differential reference clock and the differential feedback clock. The differential error signal is processed through the charge pump 3120 and applied to the VCO 3130 and thereafter to the quadrature clock generator 3140 1300 to produce the differential quadrature clock outputs that track the phase of the differential reference clock. The differential feedback clock of the PLL 3100 is generated from the differential quadrature clock outputs and the differential outputs of the VCO 3130 via the multiplexer 3150 and a divider circuit 3160. The differential quadrature phase clock output and the differential in-phase clock output are frequency doubled to generate the fully differential and balanced output. By applying differential quadrature clocks to two coupled frequency doublers provides an accurate and reliable circuit and technique over semiconductor STP variations.

Quadrature clock generation at $F_S/4$ (e.g. 30 GHz) is still very challenging and directly affects the balance and phase noise of the resulting fully differential $F_S/2$ clock at 60 GHz. A commonly used technique for creating quadrature $F_S/4$ clocks is to use a pair of VCOs locked in quadrature. This results in a doubling in the size of the $F_S/4$ VCO, and the phase noise of the locked VCO pair is worse than single standalone VCOs. The phase accuracy of the quadrature clocks is also frequency dependent. A delay-locked-loop (DLL) is another approach for generating quadrature clocks, but for deep-submicron CMOS technologies at $F_S/4$ millimeter-wave frequencies, these approaches exhibit significant amplitude and phase mismatches between stages and require multiple dummy stages to compensate. Passive techniques using quadrature hybrid couplers are also possible, but these occupy an excessive amount of die area, are lossy, single-ended, frequency selective, and also have systemic imbalances that lead to a degradation in amplitude and phase imbalance.

Figure 4:
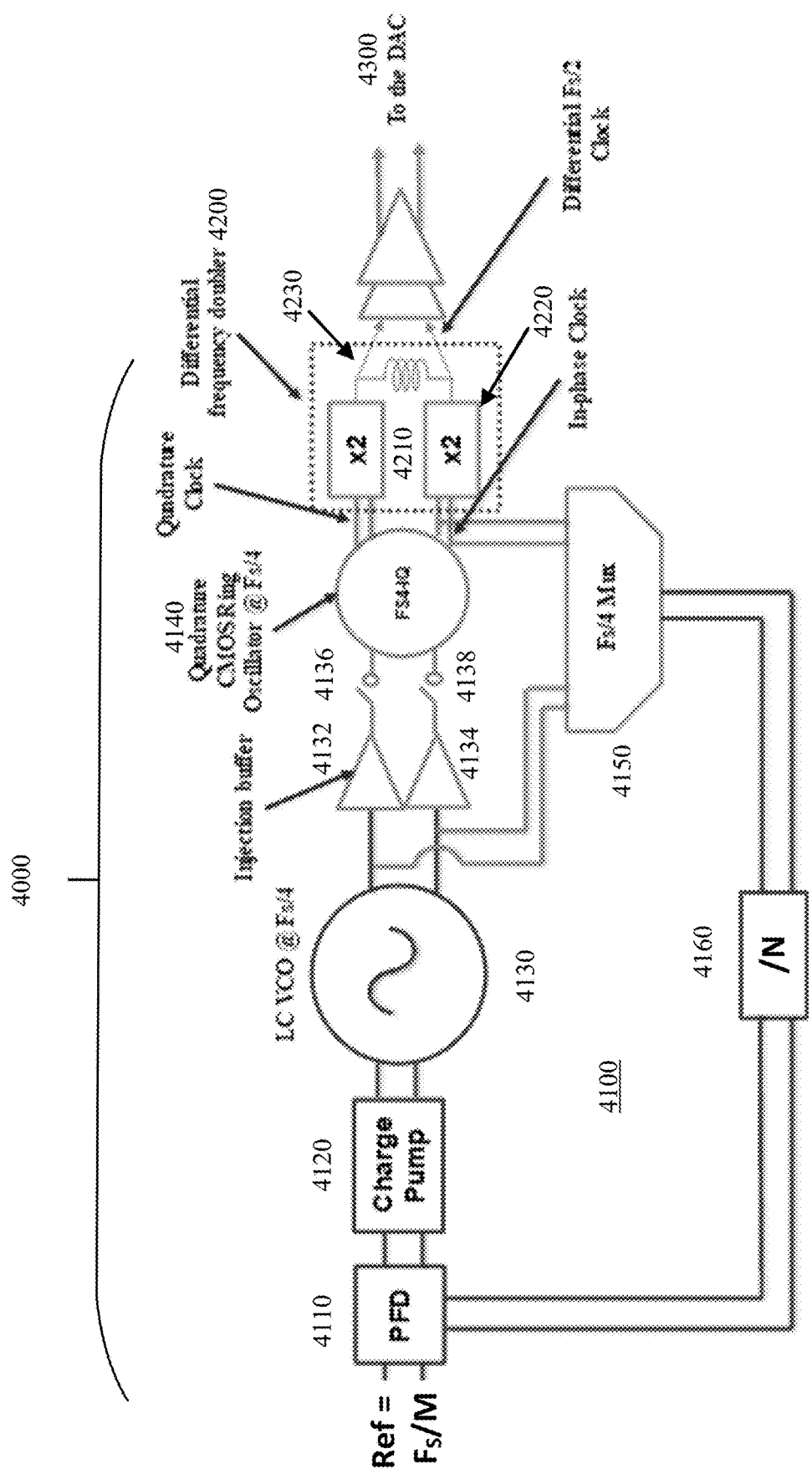
FIG. 4 is a block diagram of an example of a high frequency clock generation circuit in accordance with embodiments of this disclosure.

FIG. 4 is a block diagram of an example of a high frequency clock generation circuit 4000 using an injection locked $F_S/4$ quadrature ring oscillator in a PLL loop in accordance with embodiments of this disclosure. The high frequency clock generation circuit 4000 includes a PLL 4100 which has inputs connected to a differential reference clock having a first frequency and differential quadrature clock outputs having a second frequency connected to a differential frequency doubler circuit 4200, which in turn has fully differential and balanced output having a third frequency distributed to one or more DACs 4300. In implementations, the first frequency is a multiple of a sampling frequency ($F_S$). In implementations, the first frequency is $F_S/M$. For example, M can be 64. In implementations, the second frequency is a multiple of the first frequency. In implementations, the second frequency is $F_S/4$. In implementations, the third frequency is a multiple of the first frequency and/or the second frequency. In implementations, the third frequency is $F_S/2$.

The PLL 4100 includes a phase frequency detector 4110 which has inputs connected to the differential reference clock and differential outputs connected to a charge pump 4120. The differential outputs of the charge pump 4120 are connected to inputs of a differential VCO 4130 operating at the second frequency. In implementations, the differential VCO 4130 is a VCO with an inductor-capacitor tank. The differential outputs of the VCO 4130, which are at the second frequency, are connected to inputs of an injection locked quadrature ring oscillator 4140 operating at the second frequency via a pair of injection buffers 4132 and 4134. The injection locked quadrature ring oscillator 4140 generates highly accurate quadrature phase and in-phase clock pairs, ideal for differential $F_S/2$ generation. In particular, the injection locked quadrature ring oscillator 4140 generates four phases separated by 90°. The injection locked quadrature ring oscillator 4140 is added inside the PLL 4100, which permits the latter to reject phase noise produced by the injection locked quadrature ring oscillator 4140, both from its own active components and from its power supply ripple. The injection locked quadrature ring oscillator 4140 uses single-pole single-throw electronic switches 4136 and 4138 which can be enabled or disabled without affecting PLL operation. The injection locked quadrature ring oscillator 4140 operates over a much wider frequency range than previously disclosed approaches.

The quadrature phase and in-phase clock pairs are the output of the PLL 4100. One pair of the quadrature phase and in-phase clock pairs, and the differential outputs of the VCO 4130 are coupled to the phase frequency detector 4110 as a differential feedback clock via a multiplexer 4150 and a divide-by-N 4160, where the differential feedback clock is at the first frequency.

The quadrature phase and in-phase clock pairs are connected to frequency doublers 4210 and 4220, respectively, of the differential frequency doubler circuit 4200. In implementations, the frequency doublers 4210 and 4220 are signal squaring circuits. The outputs of the differential frequency doublers 4210 and 4220 are inductively coupled via an inductor circuit 4230 of the differential frequency doubler circuit 4200 to generate the fully differential and balanced outputs which are connected to the one or more DACs 4300 or final interleaving stages of the DACs 4300.

Operationally, the phase frequency detector 4110 outputs a differential difference or error signal that is proportional to a phase difference between the differential reference clock and the differential feedback clock. The differential error signal is processed through the charge pump 4120 and applied to the VCO 4130 and thereafter injected to the injection locked quadrature ring oscillator 4140 via the injection buffers by switching the single-pole single-throw electronic switches 4136 and 4138 appropriately. The injection locked quadrature ring oscillator 4140 produces the quadrature phase and in-phase clock pairs that track the phase of the differential reference clock. In particular, the differential feedback clock of the PLL 4100 is generated from the one of the quadrature phase and in-phase clock pairs, and the differential outputs of the VCO 4130 via the multiplexer 4150 and a divide-by-N circuit 4160. The quadrature phase and in-phase clock pairs are frequency doubled and inductively coupled to generate the fully differential and balanced output.

Figure 5:
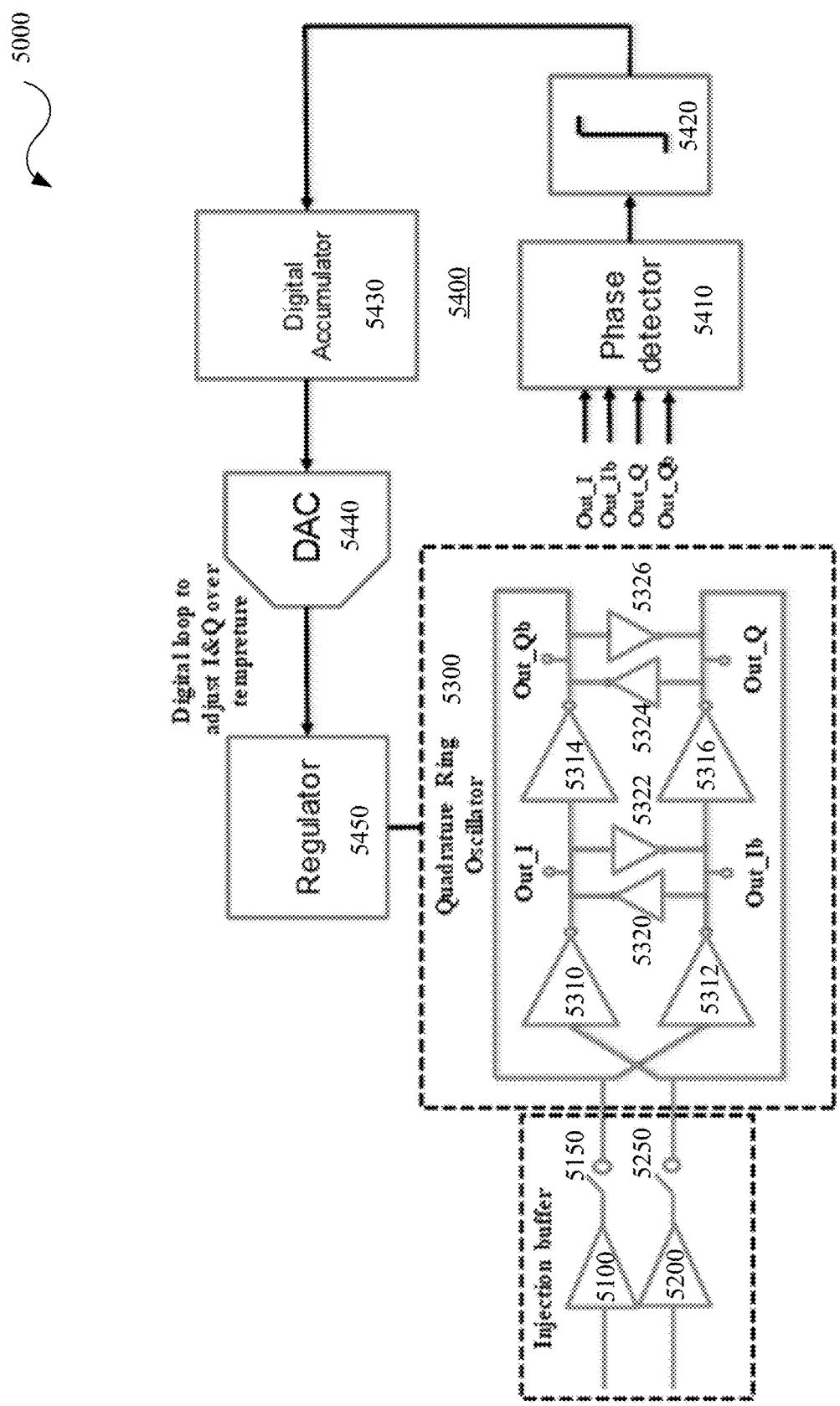
FIG. 5 is a block diagram of a quadrature clock generation circuit in accordance with embodiments of this disclosure.

FIG. 5 is a block diagram of a quadrature clock generation circuit 5000 in accordance with embodiments of this disclosure. The quadrature clock generation circuit 5000 includes a pair of injection buffers 5100 and 5200 which are connected to a quadrature ring oscillator 5300 via injection switches 5150 and 5250, respectively, (collectively an injection locked quadrature ring oscillator) which is connected to an active feedback loop circuit 5400. The quadrature ring oscillator 5300 includes four complementary metal-oxide-semiconductor (CMOS) inverting amplifier gain stages 5310, 5312, 5314, and 5316 connected in a loop with back-to-back inverting amplifiers 5320, 5322, and 5324, 5326, respectively. The back-to-back inverting amplifiers 5320, 5322, and 5324, 5326 create a positive feedback network between the CMOS inverting amplifier gain stages 5310, 5312, 5314, and 5316 to keep the amplitude and phase balance between inverting and non-inverting branches balanced and complementary. The active feedback loop circuit 5400 actively controls the in-phase and quadrature phase alignment over STP variations. The active feedback loop circuit 5400 includes a phase detector 5410, a low pass filter 5420, a digital accumulator 5430, a DAC 5440, and a regulator 5450. In implementations, the phase detector 5410 is an exclusive-or (XOR) phase detector. In implementations, the regulator 4550 is a voltage regulator.

Operationally, inputs are fed to the quadrature ring oscillator 5300 from the injections buffers 5100 and 5200 by switching injection switches 5150 and 5250 as appropriate. The quadrature ring oscillator 5300 generates in-phase and quadrature phase clock pairs which are eventually doubled and coupled for distribution to DACs as shown in FIG. 3 and FIG. 4. The phase detector 5410 senses the in-phase and quadrature phase deviation from quadrature (e.g. from 90°) for the in-phase and quadrature phase clock pairs (e.g. Out_I, Out_Ib, Out_b, and Out_Qb) and counteracts the in-phase and quadrature phase deviation by increasing or decreasing a supply level on the quadrature ring oscillator 5300 by means of the DAC 4540 and the regulator 4550.

The injection locked quadrature ring oscillator acts as a first order PLL that locks to the VCO output over a very wide range of frequencies. The bandwidth of the injection locked ring is adjustable depending on the strength of the injected $F_S/4$ clock and is of the order of 1 GHz 3-5% at $F_S/4$. Moreover, operability over a wide frequency range makes it attractive for multi-baud rate optical transceivers. The quadrature clock generation circuit 5000 provides tunability of the in-phase and quadrature phase clock pairs to a frequency doubler and the capacity to dynamically adjust the phase offset between the quadrature clocks (i.e., the four clocks separated by 90°). The active feedback loop circuit 5400 provides immunity to STP variations with frequency tunability.

Figure 6:
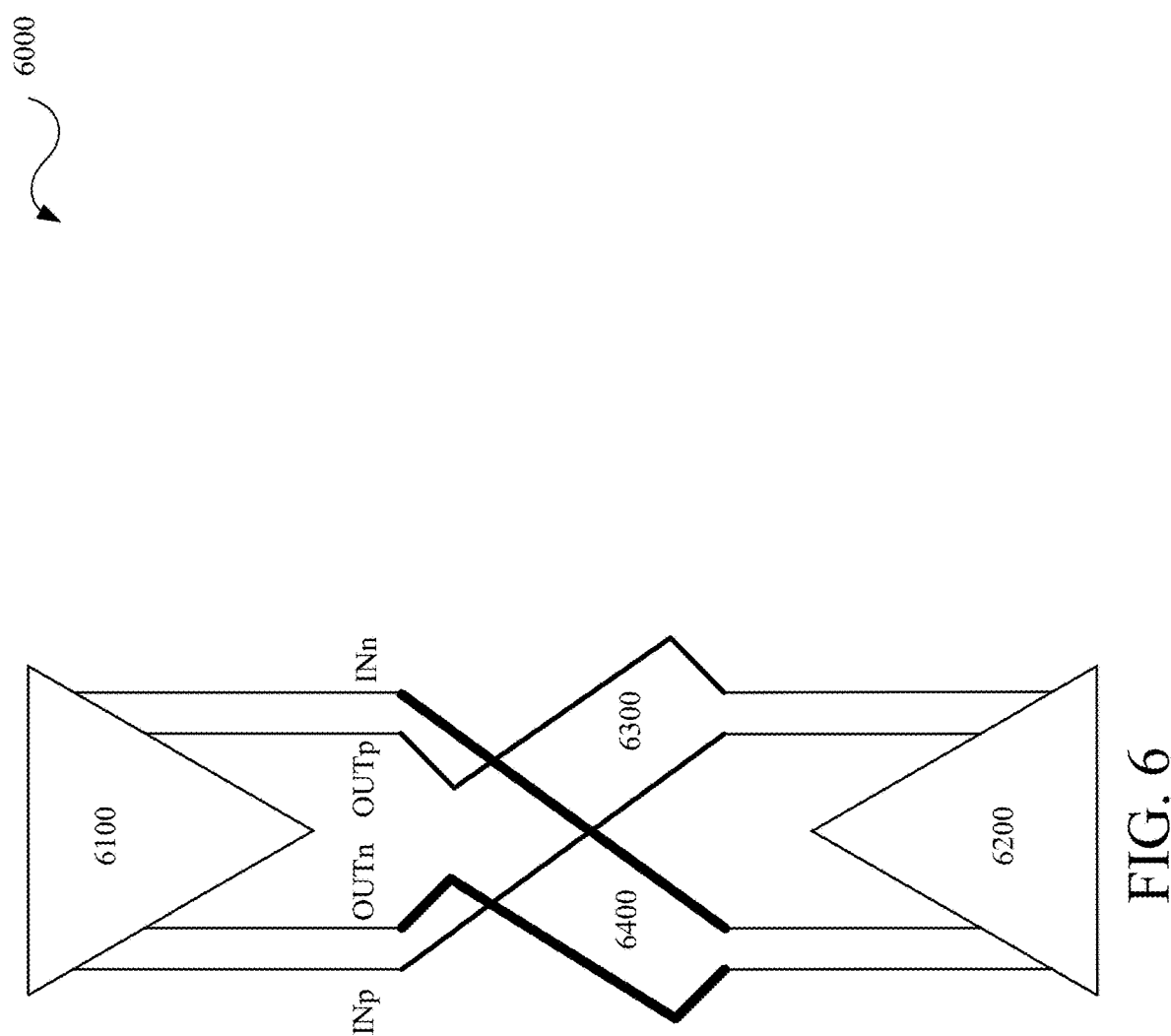
FIG. 6 is a block diagram of a symmetric layout for a quadrature ring oscillator in accordance with embodiments of this disclosure.

FIG. 6 is a block diagram of a symmetric ring oscillator layout 6000 for a quadrature ring oscillator in accordance with embodiments of this disclosure. The symmetric ring oscillator layout 6000 provides generation of quadrature clocks that are 90° apart in a fully symmetric layout design. If asymmetry exists in the layout, then the performance will degrade as $F_S/2$ will not be symmetrical. Asymmetry creates duty cycle distortion in the DAC and degrades signal-to-noise and distortion ratio (SNDR) performance of the DAC. Duty cycle distortion corrupts the performance in a linear fashion.

The symmetric ring oscillator layout 6000 includes a first segment 6100 and a second segment 6200. In implementations, the first segment 6100 and the second segment 6200 are layout identical. In implementations, the first segment 6100 and the second segment 6200 are nearly layout identical. As an illustrative example, the first segment 6100 can implement the CMOS inverting amplifier gain stages 5310 and 5312 and the back-to-back inverting amplifiers 5320 and 5322, and the second segment 6200 can implement the CMOS inverting amplifier gain stages 5314, and 5316 and the back-to-back inverting amplifiers 5324 and 5326. Each of the first segment 6100 and the second segment 6200 have two inputs and two outputs. For example, the two inputs are $IN_P$ and $IN_N$ and two outputs are $OUT_P$ and $OUT_N$. The two inputs and two outputs from the first segment 6100 and the two inputs and two outputs from the second segment 6200 are symmetrically connected together to form the ring oscillator. In implementations, one set of the symmetric connections 6300 is on one metal layer in the semiconductor device (regular line width) and another set of the symmetric connections 6400 is on another metal layer in the semiconductor device (wider line width).

Figure 7:
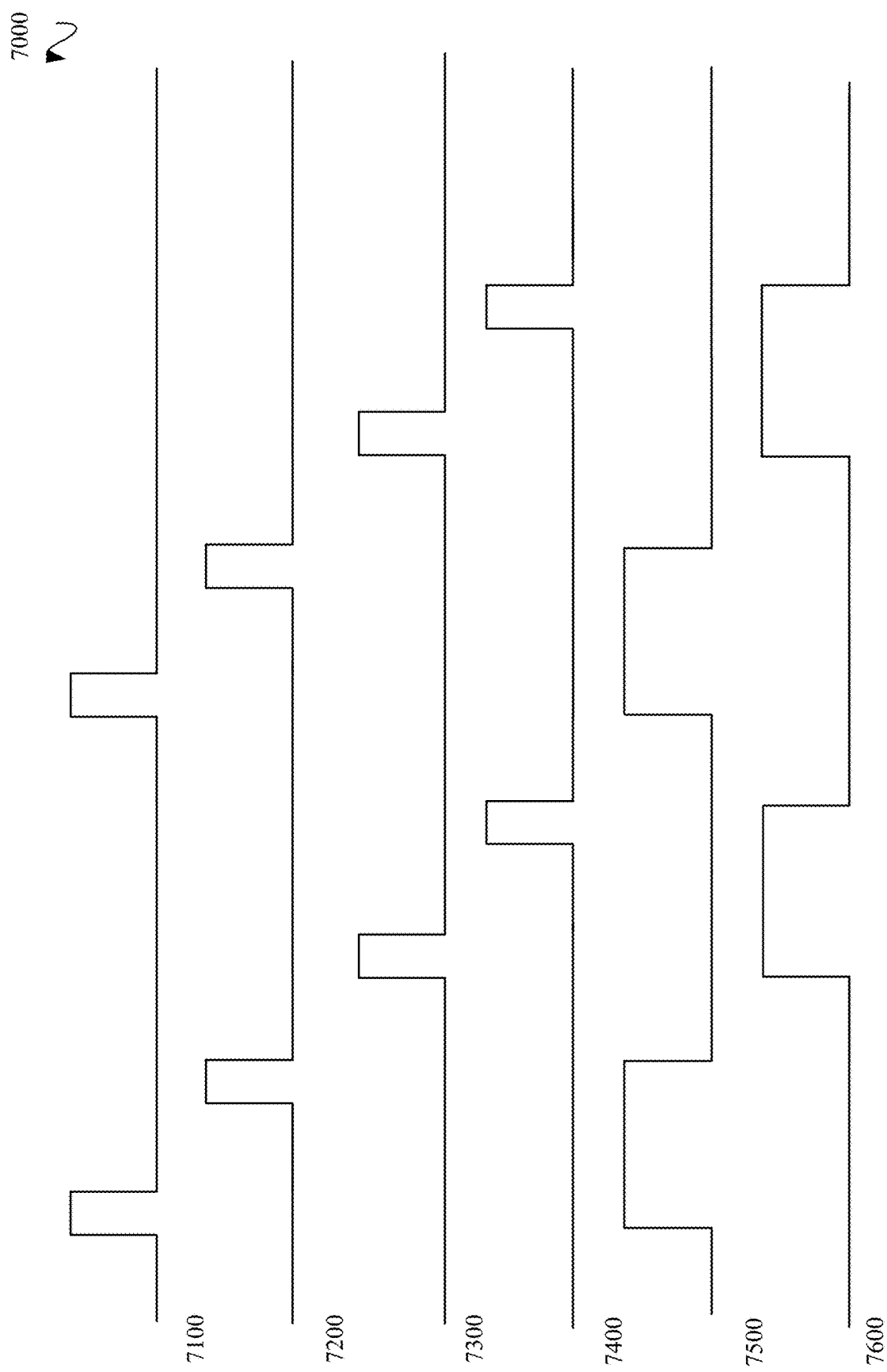
FIG. 7 is a graph of transient waveforms at an output of the quadrature ring oscillator and a differential output of the frequency doubler in accordance with embodiments of this disclosure.

FIG. 7 is a graph 7000 of transient waveforms at an output of the quadrature ring oscillator and at an output of the frequency doubler in accordance with embodiments of this disclosure. A top set of waveforms illustrates quadrature clocks which are output from the quadrature ring oscillator. In particular, the quadrature clocks include four clocks 7100, 7200, 7300, and 7400 which are 90° apart. In implementations, the four clocks 7100, 7200, 7300, and 7400 are at $F_S/4$. A bottom set of waveforms illustrates differential clocks which are output from the frequency doubler. In particular, the differential clocks include two clocks 7500 and 7600 which are 180° apart. In implementations, the two clocks 7500 and 7600 are at $F_S/2$.

Figure 8:
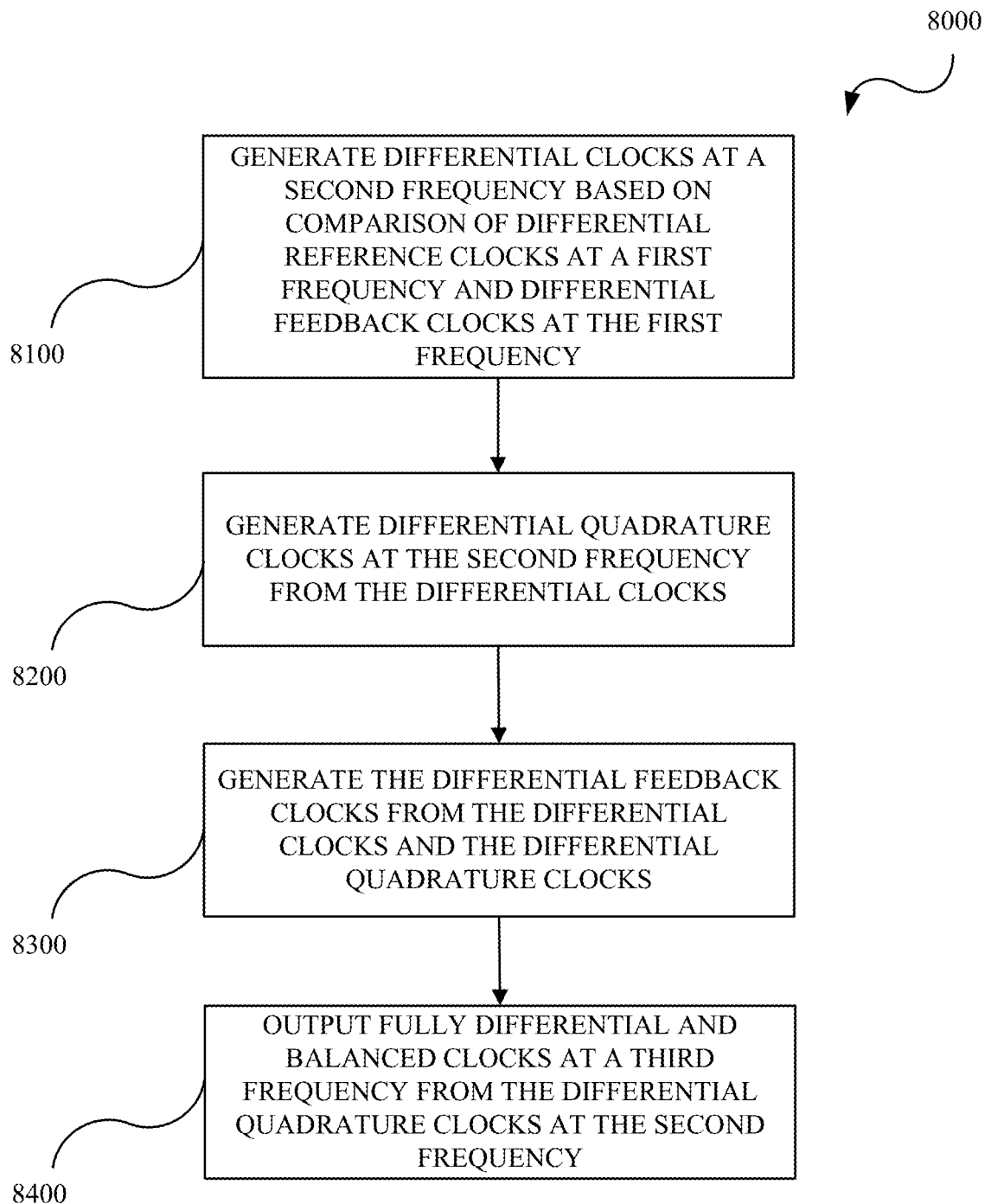
FIG. 8 is a flowchart of an example technique high frequency clock generation in accordance with embodiments of this disclosure.

FIG. 8 is a flowchart of an example method 8000 for high frequency clock generation in accordance with embodiments of this disclosure. The method 8000 includes: generating 8100 differential clocks at a second frequency based on comparison of differential reference clocks at a first frequency and differential feedback clocks at the first frequency; generating 8200 differential quadrature clocks at the second frequency from the differential clocks; generating 8300 the differential feedback clocks from the differential clocks and the differential quadrature clocks; and outputting 8400 fully differential and balanced clocks at a third frequency from the differential quadrature clocks at the second frequency. The method 8000 can be implemented by the high frequency clock generation circuit 2000 of FIG. 2, the high frequency clock generation circuit 3000 of FIG. 3, the high frequency clock generation circuit 4000 of FIG. 4, the quadrature clock generation circuit 5000 of FIG. 5, and the symmetric ring oscillator layout 6000 of FIG. 6, as appropriate and applicable.

The method 8000 includes generating 8100 differential clocks at a second frequency based on comparison of differential reference clocks at a first frequency and differential feedback clocks at the first frequency at an input of a PLL. A phase frequency detector outputs differential difference clocks by comparing the differential reference clocks and the differential feedback clocks. The differential difference clocks are processed through a charge pump and then a VCO, which is operating at a second frequency. The VCO outputs differential clocks at the second frequency. In implementations, the first frequency is a multiple of a sampling frequency ($F_S$). In implementations, the first frequency is $F_S/64$. In implementations, the second frequency is a multiple of the first frequency and/or the $F_S$. In implementations, the second frequency is $F_S/4$.

The method 8000 includes generating 8200 differential quadrature clocks at the second frequency from the differential clocks. The differential clocks from the VCO are fed to a quadrature clock generation circuit. In particular, the differential clocks are fed via a switchably connected injection buffers to an injection locked quadrature ring oscillator operating at the second frequency and provided in the PLL. The injection locked quadrature ring oscillator controls in-phase and quadrature phase alignment of the differential quadrature clocks by using an active feedback loop circuit to control the voltage supply to the injection locked quadrature ring oscillator.

The method 8000 includes generating 8300 the differential feedback clocks from the differential clocks and the differential quadrature clocks. The differential clocks from the VCO and one pair of the differential quadrature clocks (which are also the output of the PLL) are multiplexed and processed through a divider circuit to generate the differential feedback clocks at the first frequency. In implementation, the one pair of the differential quadrature clocks is the differential in-phase clocks. In implementation, the one pair of the differential quadrature clocks is the differential quadrature phase clocks. The differential reference clocks being aligned with the differential feedback clocks by adjusting the frequency of the differential clocks and/or the differential quadrature clocks until frequency and phase lock.

The method 8000 includes outputting 8400 fully differential and balanced clocks at a third frequency from the differential quadrature clocks at the second frequency. Each pair of the differential quadrature clocks are frequency multiplied using frequency doublers to generate differential outputs at the third frequency, which are inductively coupled to generate the fully differential and balanced clocks at the third frequency. The fully differential and balanced clocks are distributed to DACs. In implementations, the third frequency is a multiple of the first frequency, the second frequency, and/or the $F_S$. In implementations, the third frequency is $F_S/2$. In implementations, the third frequency is a Nyquist frequency.

In general, a high frequency clock generation circuit includes a phase frequency detector (PFD) configured to output differential error clocks based on comparison of differential reference clocks and differential feedback clocks, where the differential reference clocks and differential feedback clocks are at a first frequency, a controlled oscillator (CO) connected to the PFD, the CO configured to adjust a frequency of the CO based on the differential error clocks to generate differential clocks at a second frequency, wherein the second frequency is a multiple of the first frequency, a quadrature clock generation circuit connected to the CO, the quadrature clock generation circuit configured to generate differential quadrature clocks at the second frequency from the differential clocks, wherein the differential feedback clocks are generated from the differential clocks and one pair of the differential quadrature clocks, and a frequency doubler circuit configured to frequency double each pair of the differential quadrature clocks and output fully differential and balanced clocks at a third frequency for circuit distribution, wherein the third frequency is a multiple of the second frequency. In implementations, the quadrature clock generation circuit further includes an injection locked quadrature ring oscillator. In implementations, the quadrature clock generation circuit further includes an active feedback loop circuit to control a voltage supply for the injection locked quadrature ring oscillator. In implementations, the quadrature clock generation circuit further includes injection buffers connected to the CO, injection switches connected to the injection buffers, and a quadrature ring oscillator connected to the injection switches. In implementations, the quadrature clock generation circuit further includes a phase detector connected to the quadrature ring oscillator, and a regulator connected to the phase detector and to the quadrature ring oscillator, the phase detector configured to sense in-phase and quadrature phase deviation from quadrature for the differential quadrature clocks, and counteract the quadrature phase deviation by adjusting the supply output of the regulator. In implementations, the frequency doubler circuit further includes a first frequency doubler connected to one pair of the differential quadrature clocks, the first frequency doubler configured to generate first clocks at the third frequency, a second frequency doubler connected to a remaining pair of the differential quadrature clocks, the second frequency doubler configured to generate second clocks at the third frequency, and an induction coupler connected to the first frequency doubler and the second frequency doubler, the induction coupler configured to generate the fully differential and balanced clocks from the first clocks and the second clocks. In implementations, the quadrature ring oscillator further includes a first set of inverting amplifier gain devices connected to a first set of back-to-back inverting amplifiers, and a second set of inverting amplifier gain devices connected to a second set of back-to-back inverting amplifiers, wherein the first set of inverting amplifier gain devices, the first set of back-to-back inverting amplifiers, the second set of inverting amplifier gain devices, and the second set of back-to-back inverting amplifiers are interconnected. In implementations, the circuit further includes a first segment layout including the first set of inverting amplifier gain devices and the first set of back-to-back inverting amplifiers, the first segment chip layout having a first plurality of inputs and outputs, a second segment layout including the second set of inverting amplifier gain devices and the second set of back-to-back inverting amplifiers, the second segment chip layout having a second plurality of inputs and outputs, and a symmetrical connector layout connecting the first segment layout and the second segment layout. In implementations, the symmetrical connector layout further includes a first symmetrical connector layout on a first metal layer, and a second symmetrical connector layout on a second metal layer.

In general, a device including a phase locked loop, and a frequency multiplier circuit coupled to an output of the phase locked loop. The phase locked loop includes a detector configured to compare differential reference clocks and differential feedback clocks, where the differential reference clocks and differential feedback clocks are at a first clock rate, wherein the first clock rate is a multiple of a sampling rate, a voltage-controlled oscillator (VCO) connected to the detector, the VCO configured to generate differential clocks at a second clock rate by adjusting a frequency of the VCO based on a detector output, wherein the second clock rate is a multiple of the first clock rate, and a quadrature clock generator connected to the VCO, the quadrature clock generator configured to generate differential quadrature phase clocks and differential in-phase clocks from at the second clock rate from the differential clocks, the differential quadrature phase clocks and the differential in-phase clocks being an output of the phase locked loop, wherein the differential feedback clocks are generated from the differential clocks and one of the differential quadrature phase clocks and the differential in-phase clocks; and the frequency multiplier circuit configured to separately frequency multiply the differential quadrature phase clocks and the differential in-phase clocks and output, for device distribution, fully differential and balanced clocks at a third clock rate, wherein the third clock rate is a Nyquist rate. In implementations, the quadrature clock generator further includes an injection locked quadrature ring oscillator. In implementations, the quadrature clock generator further includes an active control loop circuit to control a supply for the injection locked quadrature ring oscillator. In implementations, the quadrature clock generator further comprises injection buffers connected to the VCO, electronic switches connected to the injection buffers, and a quadrature ring oscillator connected to the electronic switches. In implementations, the quadrature clock generator further includes a detector connected to the quadrature ring oscillator, and a regulator connected to the detector and to the quadrature ring oscillator, the detector configured to sense phase deviation from quadrature for the differential quadrature phase clocks and the differential in-phase clocks, and counteract the phase deviation by adjusting the regulator output. In implementations, the quadrature ring oscillator further includes a first set of inverting amplifier gain devices connected to a first set of back-to-back inverting amplifiers, and a second set of inverting amplifier gain devices connected to a second set of back-to-back inverting amplifiers, wherein the first set of inverting amplifier gain devices, the first set of back-to-back inverting amplifiers, the second set of inverting amplifier gain devices, and the second set of back-to-back inverting amplifiers are interconnected. In implementations, the device further includes a first segment layout including the first set of inverting amplifier gain devices and the first set of back-to-back inverting amplifiers, the first segment chip layout having a first plurality of inputs and outputs, a second segment layout including the second set of inverting amplifier gain devices and the second set of back-to-back inverting amplifiers, the second segment chip layout having a second plurality of inputs and outputs, and a symmetrical connector layout connecting the first segment layout and the second segment layout. In implementations, the symmetrical connector layout further includes a first symmetrical connector layout on a first metal layer, and a second symmetrical connector layout on a second metal layer.

In general, a method for high frequency clock generation, the method including generating differential clocks from a comparison of differential reference clocks at a first frequency and differential feedback clocks at the first frequency, wherein the differential clocks are at a second frequency and the second frequency is a multiple of the first frequency, generating differential quadrature clocks at the second frequency from the differential clocks, generating the differential feedback clocks from the differential clocks and one pair of the differential quadrature clocks, frequency doubling each pair of the differential quadrature clocks to a third frequency, wherein the third frequency is a multiple of the second frequency, and outputting fully differential and balanced clocks by coupling each of the frequency doubled differential clocks. In implementations, the method further includes actively controlling a quadrature phase deviation of the differential quadrature clocks by adjusting a regulator voltage supply when generating the differential quadrature clocks. In implementations, the generating differential clocks, the generating differential quadrature clocks, and the generating the differential feedback clocks are performed in a feedback loop.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A high frequency clock generation circuit comprising:
    a quadrature clock generation circuit configured to generate differential quadrature clocks from input frequency, wherein an active feedback loop circuit is configured to control a voltage supply for a quadrature ring oscillator; and
    a frequency doubler circuit configured to frequency double each pair of the differential quadrature clocks and output fully differential and balanced clocks for circuit distribution.

2. The circuit of claim 1, wherein a bandwidth of the quadrature ring oscillator is adjustable.

3. The circuit of claim 1, wherein the quadrature ring oscillator further comprises
    a first set of inverting amplifier gain devices connected to a first set of back-to-back inverting amplifiers; and
    a second set of inverting amplifier gain devices connected to a second set of back-to-back inverting amplifiers, wherein the first set of inverting amplifier gain devices, the first set of back-to-back inverting amplifiers, the second set of inverting amplifier gain devices, and the second set of back-to-back inverting amplifiers are interconnected.

4. The circuit of claim 1, wherein the active feedback loop circuit is configured to control an in-phase and quadrature phase alignment over temperature.

5. The circuit of claim 1, wherein the quadrature clock generation circuit further comprises injection buffers, injection switches connected to the injection buffers, and the quadrature ring oscillator connected to the injection switches.

6. The circuit of claim 1, wherein the quadrature clock generation circuit further comprises
    a phase detector connected to the quadrature ring oscillator; and
    a regulator connected to the phase detector and to the quadrature ring oscillator, the phase detector configured to sense in-phase and quadrature phase deviation from quadrature for the differential quadrature clocks, and counteract the quadrature phase deviation by adjusting the supply output of the regulator.

7. The circuit of claim 1, wherein the frequency doubler circuit further comprises
    a first frequency doubler connected to one pair of the differential quadrature clocks, the first frequency doubler configured to generate first clocks;
    a second frequency doubler connected to a remaining pair of the differential quadrature clocks, the second frequency doubler configured to generate second clocks; and
    an induction coupler connected to the first frequency doubler and the second frequency doubler, the induction coupler configured to generate the fully differential and balanced clocks from the first clocks and the second clocks.

8. The circuit of claim 1, wherein the quadrature ring oscillator includes
    a first segment chip layout including a first set of inverting amplifier gain devices and a first set of back-to-back inverting amplifiers, the first segment chip layout having a first plurality of inputs and outputs;
    a second segment chip layout including a second set of inverting amplifier gain devices and a second set of back-to-back inverting amplifiers, the second segment chip layout having a second plurality of inputs and outputs; and
    a symmetrical connector layout connecting the first segment layout and the second segment layout.

9. The circuit of claim 8, wherein the symmetrical connector layout further comprises a first symmetrical connector layout on a first metal layer, and a second symmetrical connector layout on a second metal layer.

10. A device comprising:
    a quadrature clock generator configured to generate differential quadrature phase clocks and differential in-phase clocks from input frequency; and
    a frequency multiplier circuit configured to separately frequency multiply the differential quadrature phase clocks and the differential in-phase clocks and output, for device distribution, fully differential and balanced clocks at a third clock rate, wherein the fully differential and balanced clocks are at a Nyquist rate.

11. The device of claim 10, wherein the quadrature clock generator further comprises an injection locked quadrature ring oscillator.

12. The device of claim 10, wherein the quadrature clock generator further comprises an active control loop circuit to control a supply for the injection locked quadrature ring oscillator.

13. The device of claim 10, wherein the quadrature clock generator further comprises injection buffers, electronic switches connected to the injection buffers, and a quadrature ring oscillator connected to the electronic switches.

14. The device of claim 10, wherein the quadrature clock generator further comprises
- a detector connected to a quadrature ring oscillator; and
- a regulator connected to the detector and to the quadrature ring oscillator, the detector configured to sense phase deviation from quadrature for the differential quadrature phase clocks and the differential in-phase clocks, and counteract the phase deviation by adjusting the regulator output.

15. The circuit of claim 10, wherein the quadrature clock generation circuit further comprises an injection locked quadrature ring oscillator which includes
- a first set of inverting amplifier gain devices connected to a first set of back-to-back inverting amplifiers; and
- a second set of inverting amplifier gain devices connected to a second set of back-to-back inverting amplifiers,
- wherein the first set of inverting amplifier gain devices, the first set of back-to-back inverting amplifiers, the second set of inverting amplifier gain devices, and the second set of back-to-back inverting amplifiers are interconnected.

16. The device of claim 10, wherein the quadrature clock generation circuit further comprises an injection locked quadrature ring oscillator which includes
- a first segment layout including a first set of inverting amplifier gain devices and a first set of back-to-back inverting amplifiers, the first segment layout having a first plurality of inputs and outputs;
- a second segment layout including a second set of inverting amplifier gain devices and a second set of back-to-back inverting amplifiers, the second segment layout having a second plurality of inputs and outputs; and
- a symmetrical connector layout connecting the first segment layout and the second segment layout.

17. The device of claim 16, wherein the symmetrical connector layout further comprises a first symmetrical connector layout on a first metal layer, and a second symmetrical connector layout on a second metal layer.

18. A method for high frequency clock generation, the method comprising:
- generating differential quadrature clocks from input frequency;
- actively controlling a regulator voltage supply when generating the differential quadrature clocks;
- frequency doubling each pair of the differential quadrature clocks; and
- outputting fully differential and balanced clocks by coupling each of the frequency doubled differential quadrature clocks.

19. The method of claim 18, wherein the actively controlling actively controls a quadrature phase deviation of the differential quadrature clocks by adjusting the regulator voltage supply.

20. The method of claim 18, the method further comprises
- sensing, by a phase detector connected to a quadrature ring oscillator, in-phase and quadrature phase deviation from quadrature for the differential quadrature clocks; and
- counteracting the quadrature phase deviation by adjusting the regulator supply output of a regulator connected to the phase detector and the quadrature ring oscillator.

* * * * *